United States Patent [19]

Jenkins et al.

[11] Patent Number: 5,198,756
[45] Date of Patent: Mar. 30, 1993

[54] TEST FIXTURE WIRING INTEGRITY VERIFICATION DEVICE

[75] Inventors: Jack E. Jenkins, Redwood City; William R. Maillet, Fremont, both of Calif.

[73] Assignees: atg-electronics inc., Robbinsville, N.J.; William Maillet, San Jose, Calif.

[21] Appl. No.: 737,433

[22] Filed: Jul. 29, 1991

[51] Int. Cl.⁵ .................. G01R 1/073; G01R 31/02
[52] U.S. Cl. .................. 324/158 P; 324/158 F; 324/158 R
[58] Field of Search ............ 324/158 R, 158 P, 158 F

[56] References Cited

U.S. PATENT DOCUMENTS

| 4,918,374 | 4/1990 | Stewart et al. | 324/158 R |
| 4,918,377 | 4/1990 | Buehler et al. | 324/158 R |
| 4,967,146 | 10/1990 | Morgan et al. | 324/158 R |
| 4,985,676 | 1/1991 | Karasawa | 324/158 R |
| 5,014,003 | 5/1991 | Ishikawa | 324/158 P |

Primary Examiner—Ernest F. Karlsen
Attorney, Agent, or Firm—William W. Haefliger

[57] ABSTRACT

A wiring test system in which test probes are to be oriented to engage contact points on a production circuit board, a wiring integrity verification plate comprising, in combination: a thin insulative base plate, multiple contact pads and leads attached to the plate; each of the leads extending between and interconnecting two of the contact pads, whereby multiple circuit sections are formed on the board, each circuit section including two pads interconnected by a lead; the two pads of each circuit section respectively located to be contacted by the probes of the wiring test system for providing an electrical continuity test via that circuit section, when those two probes are correctly located relative to contact points on production circuit board for testing the production circuit board.

8 Claims, 3 Drawing Sheets

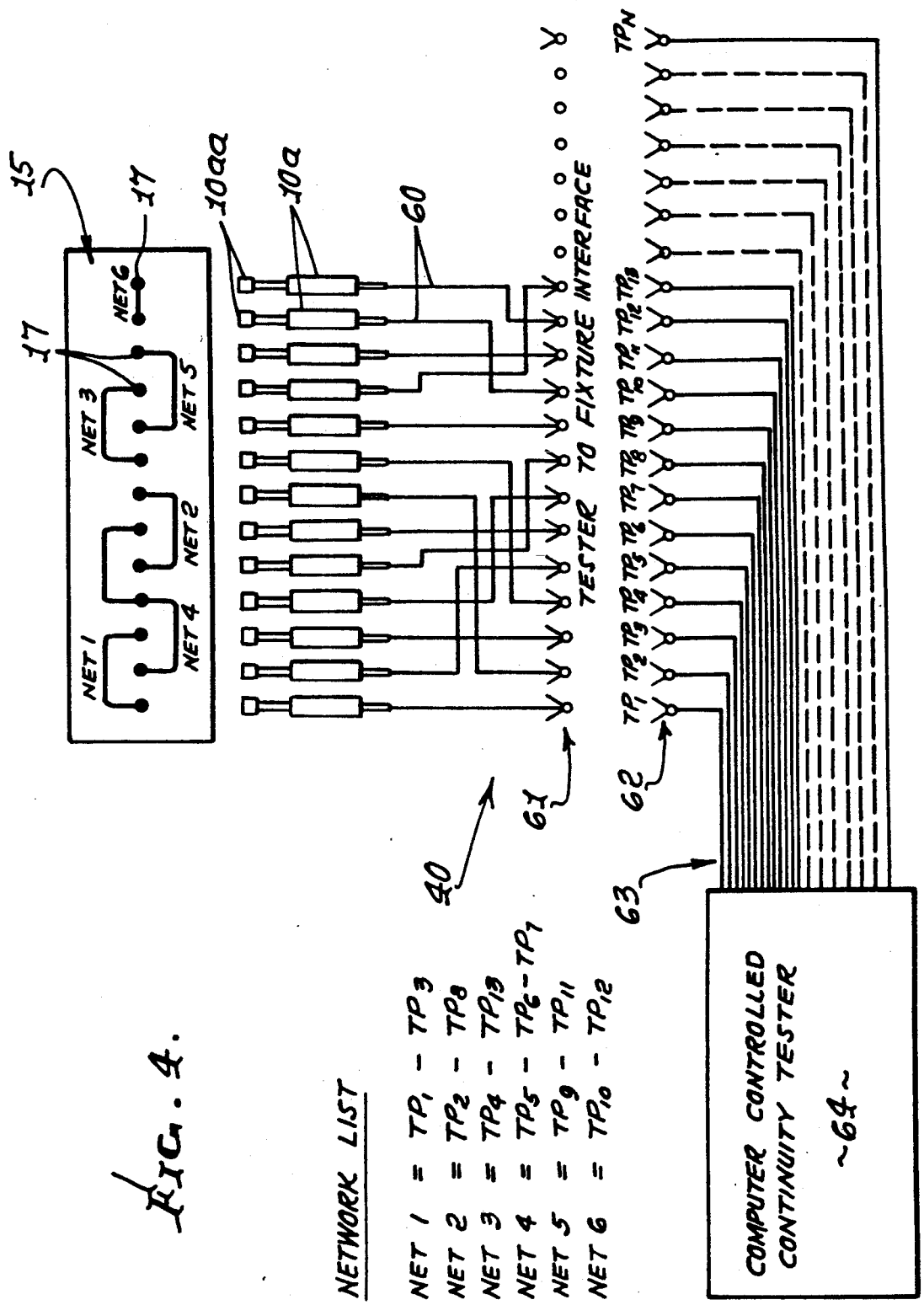

TEST FIXTURE WIRING INTEGRITY VERIFICATION DEVICE

BACKGROUND OF THE INVENTION

This invention relates generally to testing of production circuit boards, and more particularly to improvements in test systems where test probes are positioned to engage contact points on the circuit board in order to test the board.

The complexity of circuit boards, and the positioning irregularity of the many test points to be engaged by test probes requires, during set up, the expenditure of an undesirably great deal of time to accurately position the probes, in order to eliminate error. For example, hundreds of probes in a test system are commonly required to be accurately aligned with test points to be tested. Such lengthy set-up time is expensive, and there is need for means that will significantly reduce such time and enable rapid and accurate alignment of test probes with production circuit board contact points.

SUMMARY OF THE INVENTION

It is a major object of the invention to provide means whereby the above need is met and in a simple, effective, accurate manner. Basically, the invention is embodied in a wiring integrity verification plate means (i.e. "proof plate") comprising:

a) a thin base plate, and multiple contact pads and leads attached to the pads, b) each of the leads extending between and interconnecting two of the contact pads, whereby multiple circuit sections are formed on the board, each circuit section including two pads interconnected by a lead, c) the two pads of each circuit section respectively located to be contacted by two probes of the wiring test system, for providing an electrical continuity test via that circuit section, when those two probes are correctly located relative to contact points on a production circuit board for testing that production circuit board.

As will appear, the contact pads are typically presented at one side of the board, and only two contact pads are connected with any one lead.

Another object is to provide, for the majority of the interconnected pads, a spacing between each interconnected pair of pads which is greater than the spacing between either pad of the pair and another nearby pad on the plate.

Yet another object is to provide a method of orienting test probes in a wiring test system to engage contact points on a production circuit board, the steps that include a) providing a wiring integrity verification plate means having a thin insulative base plate, and multiple contact pads and leads attached to the plate, b) orienting each lead to extend between and interconnect two of the contact pads, whereby multiple circuit sections are formed on the board, each circuit section including two pads interconnected by a lead, c) and locating the two pads of each circuit section to be contacted by two probes of the wiring test system for providing an electrical continuity test via that circuit section, when those two probes are correctly located relative to contact points on production circuit board for testing the production circuit board.

A further method step includes affecting interengagement of two probes with the respective contact pads of each pair, and passing electrical current through the two probes, the two pads of each pair, and said lead interconnecting the two pads, to thereby verify the positioning of the probes to be subsequently engaged with contact points of a production circuit board.

Yet another object includes using the proof plate as referred to, to verify the integrity of "specified" wiring in the test fixture, as will be explained.

These and other objects and advantages of the invention, as well as the details of an illustrative embodiment, will be more fully understood from the following specification and drawings, in which:

DRAWING DESCRIPTION

FIG. 4 is a circuit diagram showing typical test fixture wiring integrity verification means, employing the test circuit board (proof plate 1 of FIG. 1)

DETAILED DESCRIPTION

Figure 3:
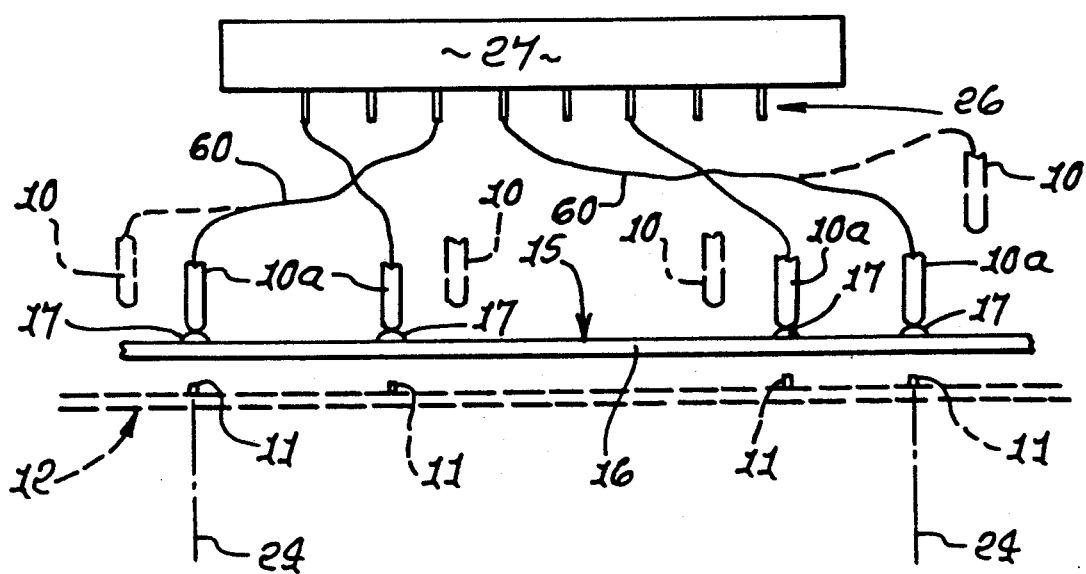
FIG. 3 is a side elevation showing a test set-up.

Referring first to FIG. 3, test probes 10 are to be oriented to engage contact points 11 on a production circuit board 12. The latter, and the probes in initial positions, are shown in broken lines. The problem is to rapidly and accurately locate the probes to be downwardly engageable with the correct contact points 11, and to verify that the probes are then, indeed, correctly positioned or oriented. See the full line correct positions of the probes at 10a in FIG. 3, in alignment with points 11.

Figure 1:
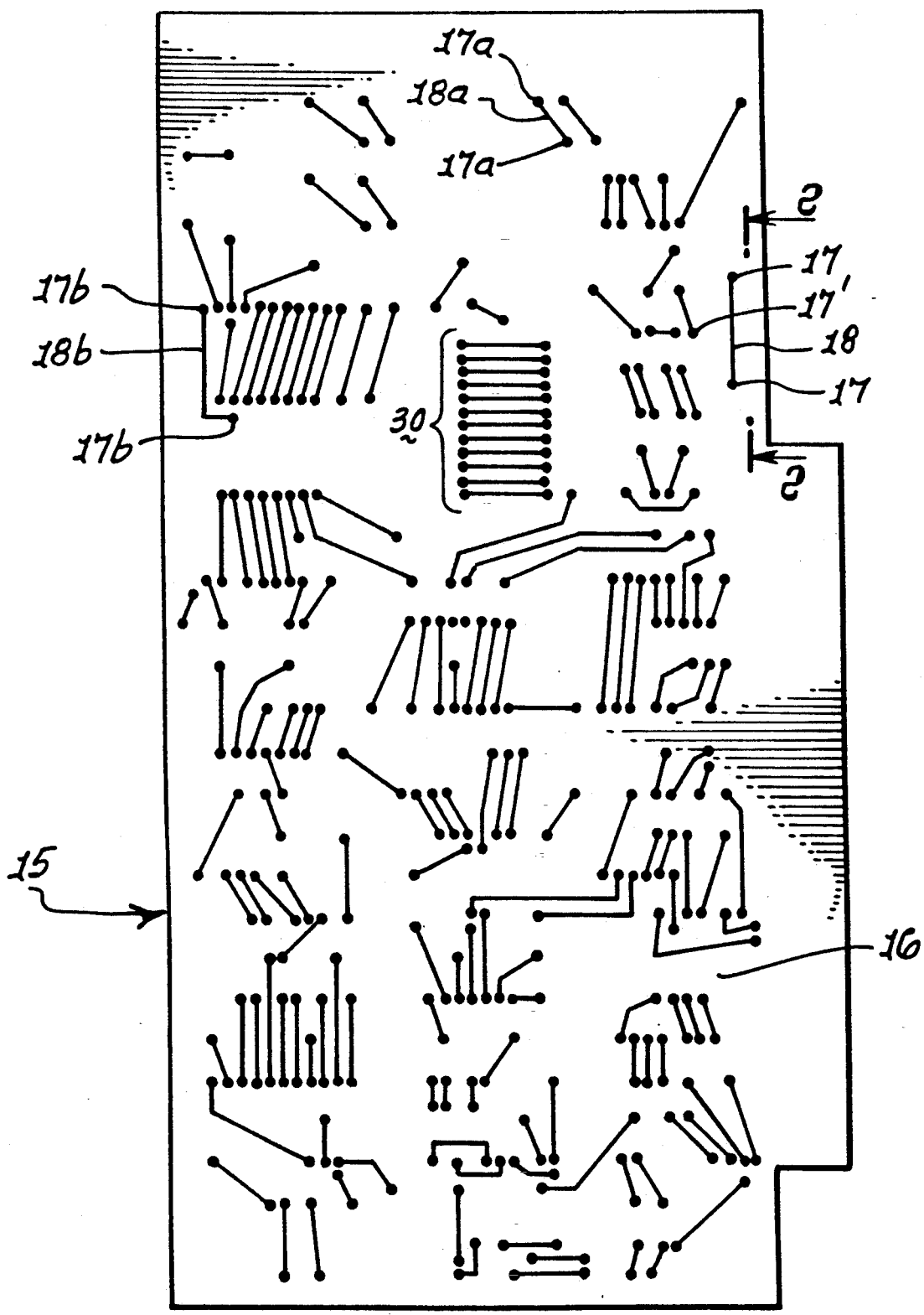
FIG. 1 is a plan view of a wiring integrity verification test circuit board incorporating the invention.
Figure 2:
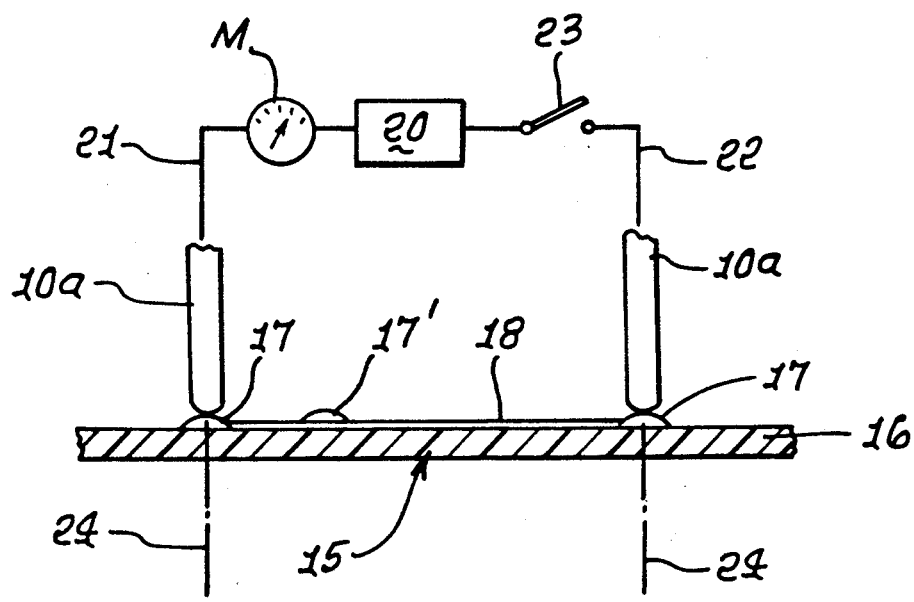
FIG. 2 is an enlarged section taken on lines 2—2 of FIG. 1.

In accordance with the invention, a wiring integrity verification plate means is provided, as for example at 15 in FIGS. 1-3. That plate means is shown to include a thin, insulative base plate 16, which may consist for example of fiber glass or synthetic resinous material. Attached (as by bonding) to the plate are multiple contact pads 17 and narrow leads 18, these being electrically conductive, and metallic for example. Each lead 18 extends between and interconnects two, and only two, of the circular contact pads, whereby multiple circuit sections are formed on the board, each such section including two pads 17 interconnected by one lead. See FIG. 2 in this regard. Pad 17' in FIG. 2 is not connected to the lead 18 but is offset therefrom, as seen in FIG. 1. Note the many such pairs (for example pair 17a—17a interconnected by lead 18a, pads 17b—17b interconnected by lead 18b, etc.). Note that the pads are of the same size, and the leads are of lesser width than the pad diameters.

FIG. 2 shows a test current source 20 connected at 21 and 22 with the two probes 10a and 10a contacting the two conductive pads 17 (for example silver solder, as is lead 18). When switch 23 is closed, a conductive circuit is established and meter M verifies that conductivity, verifying that the probes 10a are correctly positioned, in axial alignment with the axes 24 that pass through the tops of the domed pads 17, and also through the contact points on the production board circuitry, those points typically being small. Doming of the pads assures such alignment, i.e. no lateral offset of a probe relative to axis 24. Also, the height of each lead 18 is much less than the equal heights of the domed pads, to avoid contact of the probes with the leads.

FIG. 3 shows a test set-up with different probes brought into alignment, at 10a, with pads 17, to establish continuity test circuits as described. Interface terminals appear at 26, and tester circuitry at 27. The latter is used to provide the multiple test for continuity circuits, each of which is basically as shown in FIG. 2. Note also flexible wiring 60 between 10a and 26 terminals.

In order to prevent inadvertent shorting, as during maneuvering of the probes into contact with the lead interconnected pairs of pads 17, such interconnection of the pad pairs is characteristically spaced. Thus, for the majority of the interconnected pads, the spacing between an interconnected pair of pads is greater than the spacing between either pad of the pair and another nearby pad on the plate. See for example in FIG. 1, that a pad 17 is not connected with pad 17', which is closer to each of two pads 17 than interconnected pads 17 are to each other. This relationship is very clear in the zone indicated at 30, in FIG. 1, and upon inspection, it will be seen to prevail in the rest of the circuitry of FIG. 1.

The method of the invention includes the steps:

a) providing a wiring integrity verification plate means having a thin insulative base plate, and multiple contact pads and leads attached to the plate, b) orienting each lead to extend between and interconnect two of the contact pads, whereby multiple circuit sections are formed on the board, each circuit section including two pads interconnected by a lead, c) and locating the two pads of each circuit section to be contacted by two probes of the wiring test system for providing an electrical continuity test via that circuit section, when those two probes are correctly located relative to contact points on a production circuit board for testing the production circuit board.

Additionally, the method includes effecting interengagement of two probes with the respective contact pads of each pair, and passing electrical current through the two probes, the two pads of each pair, and said lead interconnecting the two pads, to thereby verify the positioning of the probes to be subsequently engaged with contact points of a production circuit board.

For example, FIG. 4 shows employment of the proof plate 15 of FIG. 1 in conjunction with circuitry 40 containing test fixture wiring 60, the integrity of which is to be verified. That wiring extends between test points or probes 10a and interface pins 61. Those pins are connectible to sockets 62 which are in turn connected by wiring 63 to a computer controlled continuity tester 64. Elements 61-64 may be considered or contained within tester circuitry 27 of FIG. 3.

As referred to, an important object of the invention is use of the proof plate 15 to verify the integrity of the wiring 60. In operation, when the pads 17 of the proof plate 15 are placed in engagement with the end contacts 10aa of probes 10a, closed circuits are established with the "shorts and opens" tester 64. When a test program is then inputted into the tester, an "open" will occur for any omitted wire connection in the group 60. Similarly, a "short" will occur in the group 60 (for example, a wire connected to the wrong probe). Thus, by using the proof plate 15, in combination with a shorts and opens tester, miswires in the group 60 can be detected and found very quickly, and prior to use of the tester with production circuit boards employed in place of plate 15.

The proof plate 15 also acts as a dust cover for the test probes 10a of the test fixtures, when that fixture is being stored.

The method of the invention also involves orienting test probes in a wiring test system to engage contact points on a circuit board, and includes the steps:

a) providing a wiring integrity verification plate means being a thin insulative base plate, and multiple contact pads and leads attached to the plate, b) orienting each lead to extend between and interconnect two of the contact pads, whereby multiple circuit sections are formed on the board, each circuit section including two pads interconnected by a lead, c) and locating the two pads of each circuit section to be contacted by two probes of the wiring test system for providing an electrical continuity test via that circuit section, when those two probes are correctly located relative to contact points on a production circuit board for testing the production circuit board.

Additionally, the method may typically include effecting interengagement of two probes with the respective contact pads of each pair, and passing electrical current through the two probes, the two pads of each pair, and said lead interconnecting the two pads, to thereby verify the positioning of the probes to be subsequently engaged with contact points of a production circuit board. In this regard, the test system typically includes a continuity tester and multiple parallel wires of specific series inter-connection configuration between the probes and the continuity tester, to establish multiple closed circuits; and passing electrical current through said closed circuits to thereby verify the integrity of said connection configuration of said multiple wires.

I claim:

1. In the method of orienting test probes in a wiring test system to engage contact points on a circuit board, the steps that include
   a) providing a wiring integrity verification plate means the plate means being a thin insulative base plate, and providing multiple contact pads to have upwardly domed surfaces and the pads and leads attached to the plate,
   b) orienting each lead to extend between and interconnect two of the contact pads, whereby multiple circuit sections are formed on the plate, each circuit section including two pads interconnected by a lead,
   c) and locating the two pads of each circuit section to be contacted by two probes of the wiring test system for providing an electrical continuity test via that circuit section, when those two probes are correctly located relative to contact points on a production circuit board for testing the production circuit board,
   d) and, for the majority of pads, providing the spacing between an interconnected pair of pads to be greater than the spacing between either pad of the pair and another nearby pad on the plate.

2. The method of claim 1 including effecting interengagement of two probes with the respective contact pads of each pair, and passing electrical current through the two probes, the two pads of each pair, and said lead interconnecting the two pads, to thereby verify the positioning of the probes to be subsequently engaged with contact points of a production circuit board.

3. The method of claim 2 wherein multiple pairs of said pads and probes are employed, and wherein the wiring test system includes a continuity tester and multiple wires of specified series inter-connection configuration between the probes and the continuity tester, to establish multiple closed circuits, and including the step of passing electrical current through said closed circuits to thereby verify the integrity of said connection configuration of said multiple wires.

4. The method of claim 1 including locating said contact pads to be presented at one side of the plate.

5. The method of claim 1 including connecting only two contact pads with any one lead.

6. The method of claim 1 including locating said interconnected pads of each pair to be out of circuit interconnection correspondence to test points of the production circuit board.

7. The method of claim 1 including providing said pads to have the same substantially circular size, and providing said leads to have less width than the pad diameters.

8. The method of claim 7 including locating said pads to be outstanding from the plate at one side thereof to be domed outwardly from the side, and locating said leads to be outstanding from the plate at said side and to lesser extent than the pads.

* * * * *